United States Patent [19]

Sakai et al.

[11] Patent Number: 5,294,750
[45] Date of Patent: Mar. 15, 1994

[54] CERAMIC PACKAGES AND CERAMIC WIRING BOARD

[75] Inventors: Hiroaki Sakai; Shinsuke Yano, both of Nagoya; Takao Soma, Nishikamo; Manabu Isomura, Nagoya, all of Japan

[73] Assignee: NGK Insulators, Ltd., Japan

[21] Appl. No.: 760,145

[22] Filed: Sep. 16, 1991

[30] Foreign Application Priority Data

Sep. 18, 1990 [JP] Japan .................. 2-246022
Sep. 18, 1990 [JP] Japan .................. 2-246023
Sep. 18, 1990 [JP] Japan .................. 2-246024
Feb. 28, 1991 [JP] Japan .................. 3-055579

[51] Int. Cl.⁵ ............................. H01L 23/02
[52] U.S. Cl. .................... 174/52.4; 361/714; 257/678; 257/712
[58] Field of Search ............ 174/52.2, 52.3, 52.4; 361/392, 393, 394, 395, 397, 399, 415, 417, 419, 381, 386, 388, 389; 257/701, 703, 704, 706, 707, 705, 678, 712, 713, 717–720

[56] References Cited

U.S. PATENT DOCUMENTS

| | | |
|---|---|---|
| 4,780,572 | 10/1988 | Kondo et al. |
| 4,801,488 | 1/1989 | Smith .................. 174/52.4 |
| 4,818,821 | 4/1989 | Wentworth et al. ........ 174/52.4 |
| 4,827,082 | 5/1989 | Horiuchi et al. .......... 174/52.4 |
| 4,831,212 | 5/1989 | Ogata et al. ............. 174/52.4 |
| 4,925,024 | 5/1990 | Ellenberger et al. ...... 174/52.4 |
| 4,931,854 | 6/1990 | Yonemasu et al. ......... 174/52.4 |
| 4,992,628 | 2/1991 | Beppu et al. ............ 174/52.4 |

OTHER PUBLICATIONS

Journal of the American Ceraic Society, vol. 56, No. 10, Oct. 1973, Columbus, US pp. 518–522; Lange: "Relation Between Strength, Fracture Energy and Microstructure of Hot-Pressed Si3N4".
Patent Abstracts of Japan, vol. 14, No. 412 (C–0755) Sep. 6, 1990 & JP-A-2157160 (Kyocera Corp) Jun. 15, 1990.

Primary Examiner—Leo P. Picard
Assistant Examiner—Bot L. Ledynh
Attorney, Agent, or Firm—Parkhurst, Wendel & Rossi

[57] ABSTRACT

A ceramic package for containing a semiconductor chip including a heat radiating plate, a base plate for wiring, and a ceramic package for containing a semiconductor chip. The package contains a ceramic board, a ceramic cap and a metal lead frame. The heat radiating plate and the ceramic board are made of silicon nitride sintered body, which is characterized in that the number of grain boundaries per a 10 μm straight line drawn in an arbitrary section of the sintered (polycrystal) body is 20 or fewer.

7 Claims, 7 Drawing Sheets

FIG._1
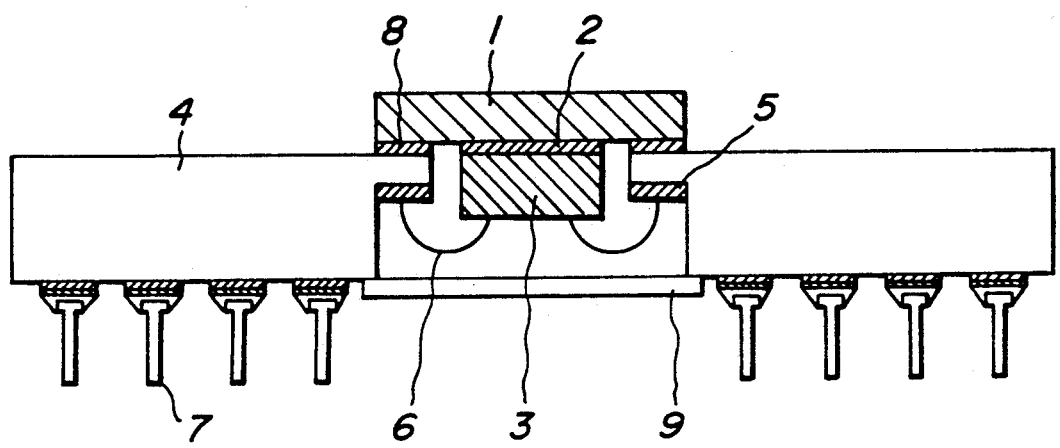
FIG._2
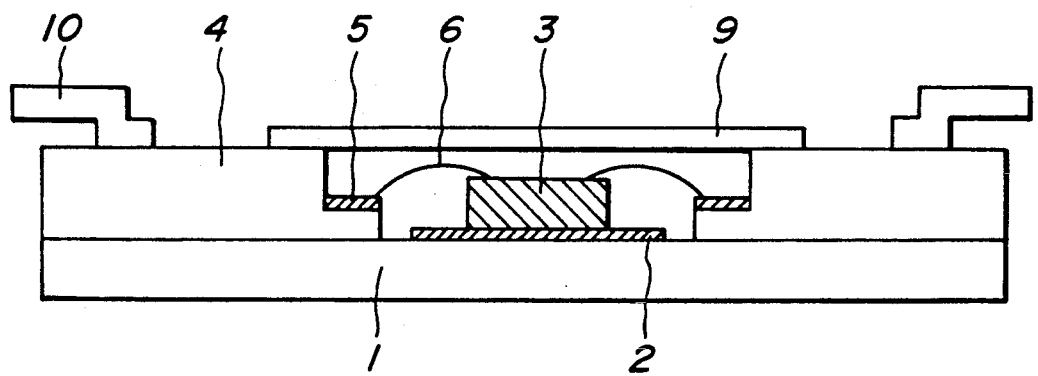

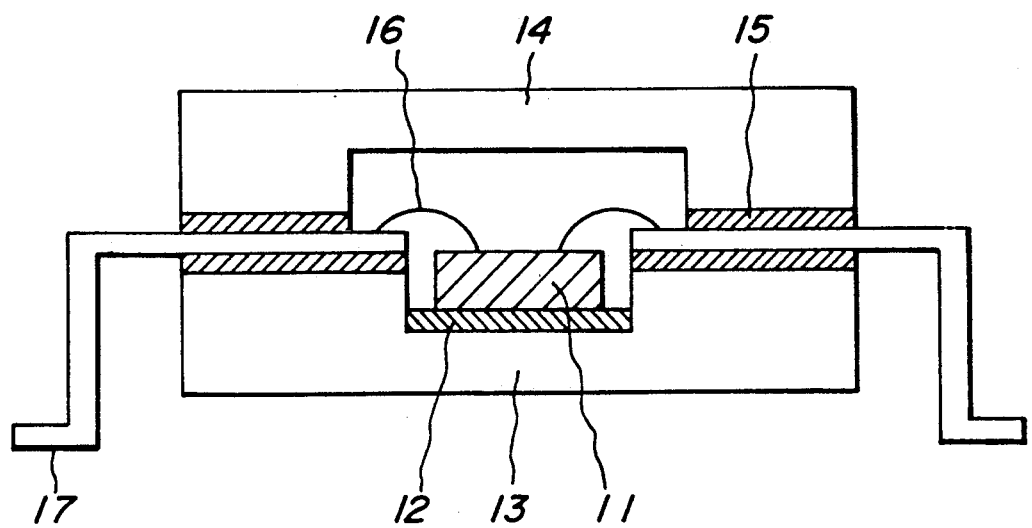
FIG_4
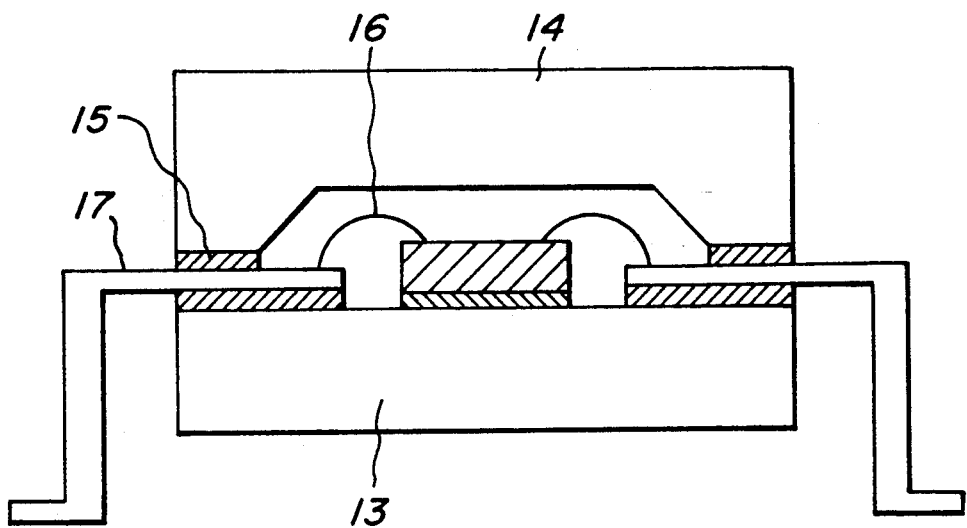
FIG_5

FIG_8
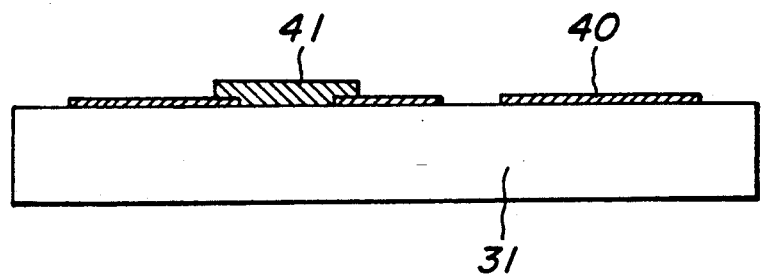
FIG_9
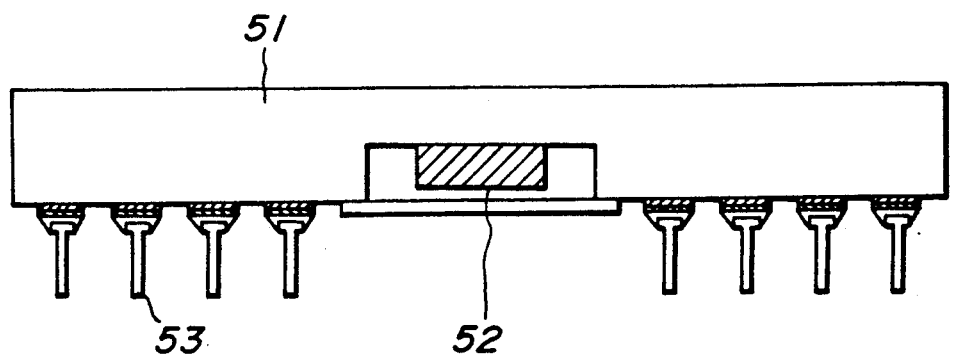

FIG_10
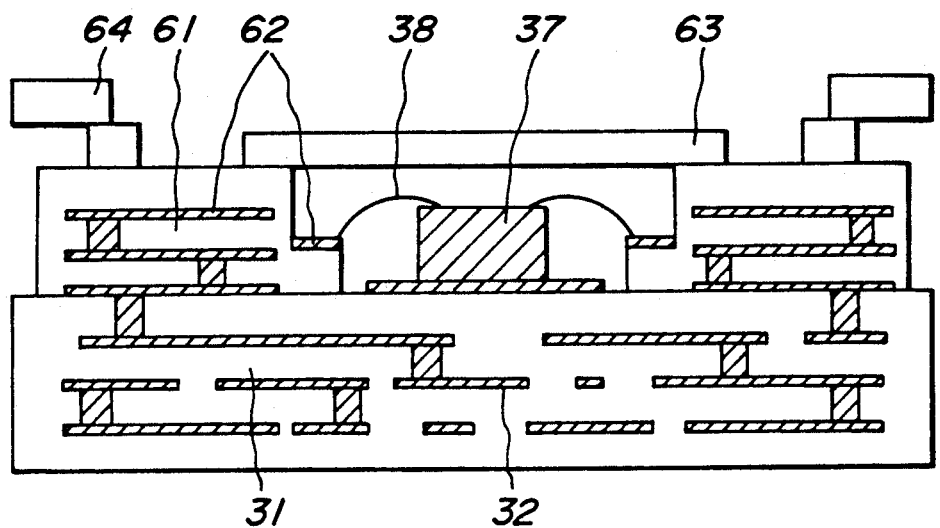
FIG_11
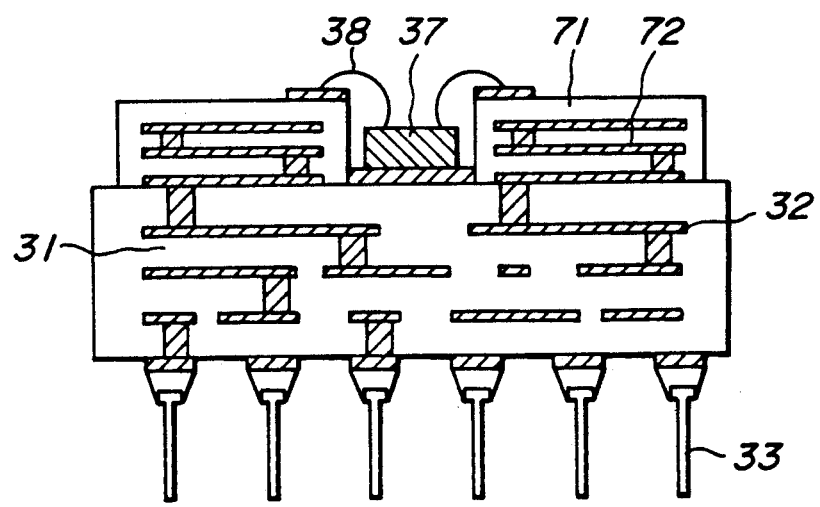

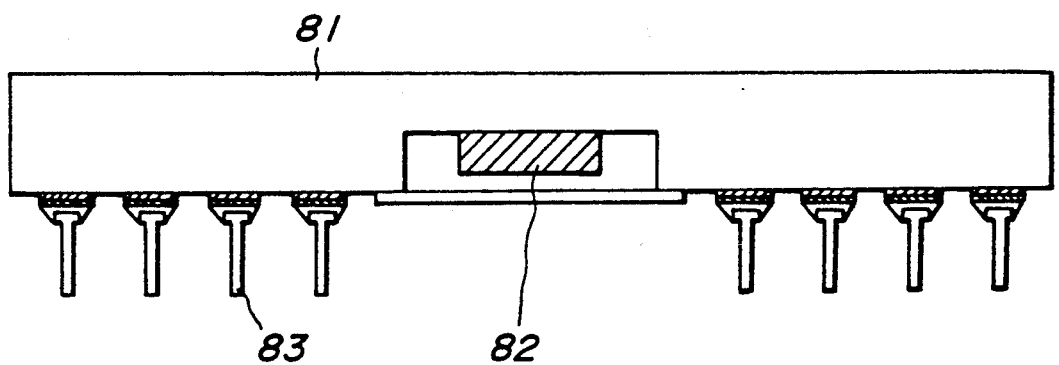
FIG_12

CERAMIC PACKAGES AND CERAMIC WIRING BOARD

BACKGROUND OF THE INVENTION

1) Field of the Invention

The present invention relates to ceramic packages, made of a silicon nitride sintered body having a large heat conductivity, for containing a semiconductor chip. The ceramic packages according to the invention have a high heat dissipation, and can be applied to various types of ceramic packages, such as pin-grid array type ceramic packages, chip-carrier type ceramic packages, cer-dip type ceramic packages, cer-quad type ceramic packages, and flat type ceramic packages. The present invention also relates to ceramic for a wiring board having a high heat dissipation.

2) Description of the Related Art

Recently, electric circuits have been highly integrated on semiconductor chips in a very large scale and operations of such electronic circuits are executed at very high speed. The amount of heat generated in a semiconductor chip when the electronic circuits formed on the semiconductor chip are operated seems to increase more and more. Particularly, in semiconductor chips having bipolar type circuits, such a tendency is found. Therefore, ceramic packages and ceramic wiring boards made of a material which can radiate the heat generated in the semiconductor chip well, i.e. a material having a large heat conductivity, are required.

Hitherto, ceramic packages made of alumina are widely used for containing such semiconductor chips that generate a large amount of heat, because alumina ceramic is more reliable and has better heat dissipation than resin.

FIG. 12 is a schematic view showing a known pin grid array type ceramic package made of alumina ceramic. On the pin grid array type package 81, a semiconductor chip 82 is mounted; a metal conductor wiring is arranged inside of the package 81; and a plurality of metal pins 83 are formed to be aligned on both sides of the package 81 as terminals for contacting the semiconductor chip 82 to the outer circuits. Further, a chip carrier type package, in which metal lead wires are used instead of the metal pins 83, made of alumina ceramic is also well known.

However, the heat dissipation of the alumina ceramic package is not sufficient to radiate the great amount of heat generated in the semiconductor chip contained therein. Accordingly, a package for containing a semiconductor chip having a large heat dissipation is strongly required. Further, a thermal expansion coefficient of the package made of alumina ceramic does not match with that of silicon, which is used as a material of the semiconductor chip. Thus, there are problems that a thermal stress is sometimes caused in the chip and the chip is thereby destroyed.

In order to solve such problems, aluminum nitride ceramic, which has better heat conductivity and whose thermal expansion coefficient matches with that of silicon, has started to be used as a material of the ceramic packages. However, the aluminum nitride ceramic may be damaged from alkali and water. Furthermore, mullite ceramic, whose thermal expansion coefficient matches with that of silicon, has also begun to be used as a material of the ceramic package. However, the heat conductivity of mullite ceramic is not sufficient, so that ceramic package made of mullite cannot radiate the heat generated in the semiconductor chip contained therein efficiently.

In order to solve these problems, ceramic packages comprising a heat radiating plate and a wiring board have begun to be used. The construction of such packages are illustrated in FIGS. 1 and 2. In these packages, a ceramic material having a large heat dissipation is used for the heat radiating plate 1, on which the semiconductor chip is mounted, in order to radiate the heat generated in the semiconductor chip; and alumina ceramic or mullite ceramic is used for the wiring board 4.

Alumina ceramic or mullite ceramic is industrially used in large quantities and the cost is therefore cheap. Further, there are such merits that alumina ceramic products or mullite ceramic products can be produced at a low sintering temperature and a process conventionally used for producing alumina or mullite ceramic packages can be used as it is. When signals are transferred through the wiring circuit at a high speed or when a resistor of a power supply circuit is required to be made small, a conductor having a small conducting register, i.e. metal of Ag series, Cu series or Au series is used for the wiring. Therefore, it is required to use ceramics which can be sintered at a low temperature of less than 1100° C., i.e. a temperature less than the melting points of these metals, for the wiring board.

There is further suggested a package comprising a wiring board, in which an insulating material is made of polyimide resin and a conductor pattern is formed by a photo lithographing a thin film formed thereon by sputtering, depositing or coating; and a heat radiating plate made of aluminum nitride or silicon carbide into which BeO is added.

In order to contact the heat radiating plate and the board including a wire distribution inside thereof, glass, Au, Cu, or an activated metal, which is made by adding Ti or Zr into an Au alloy or into a Cu alloy, is used. Or, conductors formed on the respective boards for the purpose of electric connection are sometimes connected to each other by means of a metal solder or by sintering a metal paste arranged between the conductors. However, when alumina ceramic is used as the insulating material of the wiring board, since the thermal expansion coefficient of the alumina ceramic does not match with that of the silicon carbide, into which BeO is added, and with that of aluminum nitride used as the insulating material of the heat radiating plate, a crack would be caused in the contacting portions of these plates due to thermal stress. In such a case, it is necessary to form a ceramic frame having an intermediate thermal expansion coefficient between both of the plates.

Aluminum nitride, which is used as the insulating material of the heat radiating plate, does not prevent damage from environments such as water and alkali, so the reliability of the package as a whole is detracted. Further, silicon nitride also has a problem that its withstand voltage is low, because there exists an insulating characteristic only at grain boundary portions in the silicon nitride body.

Further, cer-dip type, cer-quad type or flat type package for containing a semiconductor chip is also well known. The structure of the package of such type is shown in FIG. 4. The package comprises a ceramic base 13 and a ceramic cap 14, which is arranged on a ceramic base 13 and contacted to each other so as to seal up a semiconductor chip 11, to cover it a conductive layer 12 made of Au, by means of a bonding agent such as glass or resin. There is provided a metal lead frame 17, which is for electrically connecting the semiconductor chip 11 to the outer circuits.

However, when using alumina as a material of such type package, since the fracture toughness of alumina is low, edges of the package are apt to be broken. Further, there are problems such that the heat dissipation of alumina is not sufficient to radiate the heat generated in the semiconductor chip contained in the package and that the thermal expansion coefficient of alumina is not coincident with that of silicon, as stated above. Alumina nitride or silicon carbide, into which a little amount of BeO is added, has begun to be used as a material of the package of such type.

Aluminum nitride ceramic has a thermal expansion coefficient being coincident with that of silicon, but it does not prevent damage from water and alkali, as mentioned above. Silicon carbide ceramic into which a little amount of BeO is added, has an insulating characteristic only at grain boundaries, the withstand voltage by the silicon carbide ceramic is low. Furthermore, the density of the silicon carbide ceramic is not made high by general sintering but by hot press sintering. Thus, the processing cost for manufacturing packages made of the silicon carbide ceramic becomes very high.

Hitherto, as the material of the ceramic wiring board alumina ceramic is widely used, because the base plate made of alumina ceramic has a high reliability and a high heat dissipation in comparison with the board made of resin. However, the alumina ceramic board is worse than the board made of resin regarding a practical strength. Additionally, the heat dissipation is not sufficient to radiate the heat generated in the semiconductor chip, in which a great number of circuits are highly integrated.

In order to improve the heat dissipation of the board, aluminum nitride ceramic, which has a higher heat conductivity, and silicon carbide, into which is added a little amount of BeO, has begun to be used as a material for the board.

However, as mentioned in the above, aluminum nitride ceramic does not prevent damage from the environment, such as water and alkali. Additionally, since the heat expansion coefficient of aluminum nitride ceramic is greatly different from that of metal, portions of the ceramic base plate which contact metal pins or metal lead wires therewith are apt to be broken due to stress caused in the board due to the difference between the heat expansion coefficients.

Further, when using silicon carbide to which has been added a little amount of BeO, there is a problem in electrical characteristics, such that its dielectric constant is large, i.e. about 40. Additionally, silicon carbide does not prevent damage from voltage and the processing cost for manufacturing a board made of silicon carbide becomes high because hot press sintering is necessary to make the density thereof high.

SUMMARY OF THE INVENTION

The first invention of the present application provides a ceramic package for containing a semiconductor chip in which heat dissipation is improved.

According to the first invention, a ceramic package for containing a semiconductor chip comprises:
a heat radiating plate made of silicon nitride for mounting a semiconductor chip thereon; and
a wiring board comprising a wire distribution for transferring electric signals and a wire distribution for power supply.

As well known, silicon nitride has a high insulating characteristic and is excellent in preventing damage from environments, such as water and alkali. Further, the thermal expansion coefficient of silicon nitride is more than that of silicon, i.e. 3~4 ppm/°C. in comparison with the thermal expansion coefficient of alumina, i.e. 6~7 ppm/°C. Therefore, the reliability of the package, in which a heat radiating plate made of silicon nitride is used, is improved.

According to the second invention, a ceramic package for containing a semiconductor chip comprises:
a ceramic base for mounting a semiconductor chip thereon being made of silicon nitride sintering body;
a ceramic cap for covering the ceramic base being connected to the ceramic base by means of glass or agent of resin in order to seal the semiconductor chip in the package; and
a lead frame made of metal being arranged between the ceramic base and the ceramic cap.

In the ceramic package according to the second invention, since a silicon nitride ceramic sintered body is used for the wiring board, it is possible to provide a ceramic package having a wiring board to prevent damage from the environment, and which can radiate the heat generated in the mounted semiconductor chip in a good manner, and which a high mechanical strength and an excellent electrical characteristic.

It is preferable that the ceramic wiring board is characterized in that:
the ceramic used as a material of the board is made of polycrystal body of silicon nitride, and the number of grain boundaries of the polycrystal body is 20 or fewer per 10 μm of a straight line drawn in an arbitrary section of the crystal body.

In the first and second inventions, the plate for mounting the semiconductor chip (heat radiating plate in the first invention, or base plate for wiring in the second invention) is made of silicon nitride sintered body containing not more than 0.3 wt % or less of aluminum when calculated as alumina. After sintering, the sintered body is characterized in that the number of grain boundaries of silicon nitride per a length of 10 μm is 20 or less when measuring along a straight line drawn in arbitrary section of the silicon nitride body. Generally, when sintering the silicon nitride body, a sintering additive is added for forming a liquid phase in the body during when the body is sintered. Typically, a rare earth element oxide, alkaline earth metal, or other a metal oxide is used as the sintering additive. Molybdenum or Tungsten metal, oxide or composed of Molybdenum or oxide or compound of tungsten metal is sometimes added in order to color the sintered body as peculiar additives for the ceramic package.

Silicon nitride sintered body having any composition can be applied to the present invention so far as the amount of aluminum contained in the body is less than the above mentioned limitation since the thermal conductivity of the sintered body is determined by the amount of aluminum contained in the body.

The silicon nitride sintered body used in the package according to the invention has its thermal conductivity of more than 40 W/mk, for example, 100 W/mk. Since the thermal conductivity is sufficiently larger than that of alumina, i.e. 20 W/mk, packages having a high heat dissipation can be obtained. If the silicon nitride sintered body containing more than 0.3 wt % or less of aluminum when calculated as alumina is used, the thermal conductivity of ceramic body of the package would be detracted and then the packages made of such ceramic body could not radiate the heat generated in the semiconductor chip mounted therein sufficiently.

Further, the silicon nitride used in the package according to the invention is excellent in preventing damage from the environment, so there is no problem such that the reliability of the package is detracted. Moreover, the voltage resistance of the silicon nitride is very high.

The ceramic package according to the second invention comprises a ceramic cap. It may be possible to use an inexpensive ceramic, such as an alumina series ceramic, mullite series ceramic and glass ceramic, as a material of the ceramic cap. Although thermal conductivities of these ceramics are not so high, the the semiconductor chip is not directly mounted on the ceramic cap and the cap does not distribute the heat of the package. The same silicon nitride used in the wiring board may also be used for the ceramic cap without question. However, in order to keep the reliability of the package high, it is much better to use mullite type ceramic or glass ceramic having its thermal expansion coefficient of 2-5 ppm/°C. for the ceramic cap because the thermal expansion coefficients of them are almost coincident with that of the silicon nitride, which is used for the wiring board. When using the alumina series ceramic as the material of the ceramic cap, it is desirable to adhere the cap to the base plate by means of glass, which has an intermediate thermal expansion coefficient between the silicon nitride sintered body according to the invention, and the alumina series ceramic; or it is desirable to arrange a damping frame which also has an intermediate thermal expansion coefficient between the base plate and the cap.

According to the third invention, polycrystal silicon nitride is used as the material of the wiring board. As well known, silicon nitride has a high strength and is excellent in preventing against damage from the environment. Further, since the thermal expansion coefficient of silicon nitride is closer to that of silicon in comparison with alumina, the reliability of the base plate when mounting the semiconductor chip thereon becomes high. However, the composition of general silicon nitride is determined considering a mechanical strength at a high temperature; and the thermal conductivity of such silicon nitride is as small as that of alumina ceramic. Therefore, the board having a high heat dissipation could not be obtained.

As stated in the above, in the base plate for wiring board according to the third invention of the present application, insulating layers of the board are made of polycrystal silicon nitride body in which the number of grain boundaries of silicon nitride per a length of 10 μm is not more than 20. Preferably, the base plate is made of polycrystal silicon nitride body containing not more than 0.3 wt % or less of aluminum when calculated as alumina, and conductors are made of metal, such as tungsten, molybdenum and zirconium, which can be formed on the surface of or inside the polycrystal silicon nitride body simultaneously when the board is sintered. Alternatively, conductors may be made of nitride or boride of metals such as zirconium, tantalum or vanadium, which can be also formed at the same time that the board is sintered. It should be noted that the conductors may be formed by thick metal film made of Ag, Au or Cu, thin metal film formed with the aid of sputtering, deposition or metal plating, or alloy of metal molybdenum and metal manganese.

In case forming the conductors made of tungsten or metal molybdenum at the same time that the polycrystal silicon nitride body of the board is sintered, a part of the metal of tungsten or molybdenum sometimes reacts with the silicon nitride at a high sintering temperature more than 1800° C., resulting in that the metal becomes a silicide. Particularly, such reaction is apt to be generated on the boundary surface between the conductors and the board, but since the resistance of the silicide is lower than that of the tungsten or of the molybdenum metal, no problem occur.

In the board made of silicon nitride according to the third invention since the thermal conductivity of the silicon nitride is more than 40 W/mk, typically 100 W/mk, which is sufficiently larger than that of alumina, i.e. 20 W/mk, the dissipation of the board is improved remarkably. Further, the silicon nitride having a large strength is excellent in preventing against damage from the environment, and its thermal expansion coefficient is almost the same as that of silicon. Furthermore, the silicon nitride having a small dielectric coefficient of 6~8, which is smaller than that of alumina, i.e. 9~10, is excellent in electric insulating characteristics. Therefore, it is possible to obtain a ceramic wiring board having an excellent characteristic by combining the silicon nitride with the conductors mentioned above.

Moreover, it is possible to obtain a wiring board having a composited structure with a more excellent characteristic, by combining a board made of the silicon nitride and another base plate made of different material. For example, in order to make the wiring formed in the board to be suitable to transmit electric signals at higher speed, it may be possible to form the board of different material and then combine it with the base plate made of silicon nitride. That is to say, a material having a smaller dielectric coefficient than that of silicon nitride, which is capable of transmitting the electric signal with a high speed or a material being capable of forming conductors made of a material having a low conductivity, such as Ag and Au, which is suitable for transmitting the electric signals at high speed, is used as the material of the other board. Then the other plate and the board of silicon nitride are combined. The board made of silicon nitride is used as a power supply circuit.

In such a manner, combination of the wiring board for the power supply circuit made of silicon nitride with the wiring board made of the other different material in accordance with the desired results in excellent heat dissipation of silicon nitride which is characterized in that the number of polycrystal grain boundaries of silicon nitride per length of 10 μm is not more than 20 when measured along a straight line drawn in an arbitrary section of the silicon nitride body and contains not more than 0.3 wt % of aluminum when calculated as alumina with the characteristic of the other material. Thus, the combination enhances the effect of the invention.

BRIEF DESCRIPTION OF THE DRAWINGS

FIG. 1 is a cross sectional view showing the construction of a first embodiment of a ceramic package according to the first invention of the present application;

FIG. 2 is a cross sectional view depicting the construction of a second embodiment of a ceramic package according to the first invention of the present application;

FIG. 4 is a cross sectional view representing the construction of a first embodiment of a ceramic package according to the second invention of the present application;

FIG. 5 is a cross sectional view showing the construction of a second embodiment of a ceramic package according to the third invention of the present application;

FIG. 8 is a cross sectional view representing the construction of a third embodiment of a base plate for wire distribution according to the third invention of the present application;

FIG. 9 is a cross sectional view showing the construction of a fourth embodiment of a base plate for wire distribution according to the third invention of the present application;

FIG. 10 is a cross sectional view depicting the construction of a fifth embodiment of a base plate for wire distribution according to the third invention of the present application;

FIG. 11 is a cross sectional view illustrating the construction of a sixth embodiment of a base plate for wire distribution according to the third invention of the present application; and FIG. 12 is a cross sectional view representing the construction of a conventional ceramic package.

DETAILED DESCRIPTION OF THE PREFERRED EMBODIMENTS

Figure 3:
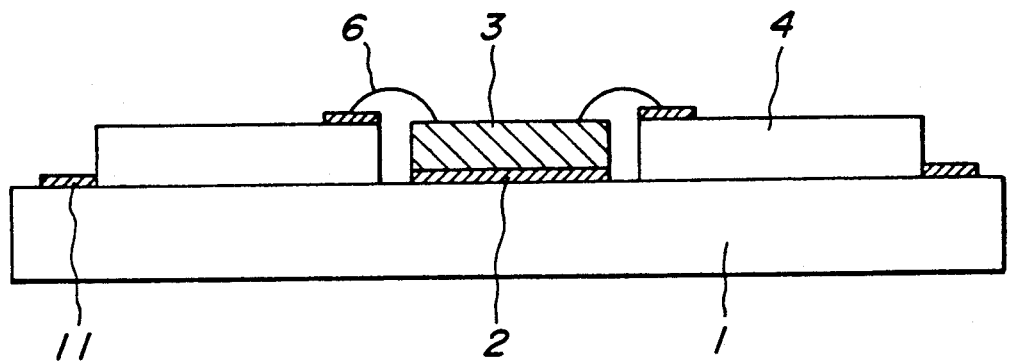
FIG. 3 is a cross sectional view illustrating the construction of a third embodiment of a ceramic package according to the first invention of the present application.

FIGS. 1 to 3 are cross-sectional views representing constructions of embodiments of ceramic packages according to the first invention of the present application, respectively. In the first embodiment shown in FIG. 1, the pin grid type ceramic package comprises a heat radiating plate 1 made of silicon nitride characterized in that the number of polycrystal grain boundaries of silicon nitride per a length of 10 $\mu$m is not more than 20 when measured along a straight line drawn in an arbitrary section of the silicon nitride body of the plate 1 and in that a raw material of silicon nitride contains not more than 0.3 wt % of aluminum when calculated as alumina. On the silicon nitride plate 1, is mounted a semiconductor chip 3 by means of a gold (Au) plating layer 2. The ceramic package further comprises a wiring board 4 made of mullite. The board 4 comprises conductors 5, which are connected to the semiconductor chip 3 via bonding wires 6, and a plurality of metal pins 7 for use in terminals for connecting the semiconductor chip 3 to outer circuits. Between the heat radiating plate 1 and the wiring board 4, is arranged an activated metal layer 8 for connecting them to each other, and a cap 9 is arranged across both edges of the base plate 4 so as to seal up the semiconductor chip 3 within a concave portion of the package.

FIG. 2 shows a chip-carrier type ceramic package, in which metal leads 10 are arranged instead of metal pins 7 of the pin-grid type ceramic package shown in FIG. 1.

In a ceramic package shown in FIG. 3, the wiring board 4 is made of polyimide series resin. Inside the board 4 there are provided thin multiple wiring layers made of gold (Au). In the package shown in FIG. 3, conductive pads 11 are provided for connecting the semiconductor chip 3 to outer circuits.

FIGS. 4 and 5 are cross-sectional views representing embodiments of cer-dip type ceramic package according to the second invention of the present application. Each of the cer-dip type ceramic packages comprises a ceramic board 13 made of the predetermined characteristic. On the board 13, a semiconductor chip 11 is mounted by means of conductive layer 12 made of gold (Au). Each package comprises a ceramic cap 14, which is arranged on the board 13 by means of a bonding agent of resin to seal the semiconductor chip 11 in a concave portion of the board 13, and a metal lead frame 17 which is arranged to be sandwiched between the cap 14 and board 13. To the metal lead frame 17, are connected bonding wires 16 to electrically connect the semiconductor chip 11 to the outer circuits.

Figure 6:
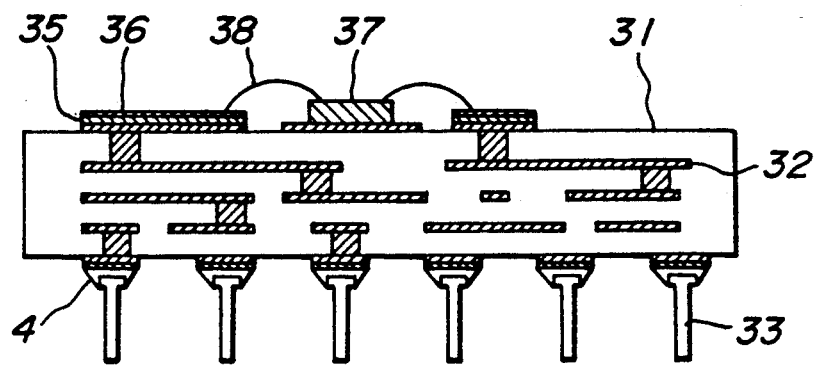
FIG. 6 is a cross sectional view depicting the construction of a first embodiment of a base plate for wire distribution according to the third invention of the present application.
Figure 7:
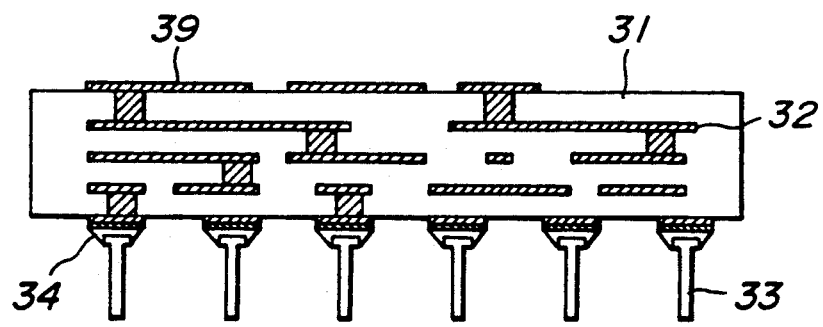
FIG. 7 is a cross sectional view illustrating the construction of a second embodiment of a base plate for wire distribution according to the third invention of the present application.

FIGS. 6 to 8 are cross-sectional views illustrating embodiments of wiring board according to the third invention of the present application. In these embodiments, a wire distribution circuit is constituted of silicon nitride insulating layer 31, which is formed by green sheet layers, and metal conductors 32 made of tungsten. Metal pins 33 are formed on a conductive portion of one of the surfaces of the board as external terminals by means of Ag solder 34.

In the embodiment shown in FIG. 6, on a conductive portion of the other surface of the board 31 is covered with Ni plating 35 and Au plating 36 and the semiconductor chip 37 is connected to the Au plating 36 by means of wire bondings 38. On the other hand, in the embodiment shown in FIG. 7, a Cr/Cu sputtering layer 39 is formed on one of the surfaces of the board 31 as the conductive portion. Further, in the embodiment shown in FIG. 8, on the board 31, there are provided a thick conductive layer 40 made of Ag metal, Au metal or Cu metal and a resister 41 to form a thick film circuit.

FIG. 9 is a cross sectional view showing another embodiment of the third invention according to the present application. In this embodiment, the board made of silicon nitride is applied to a pin grid array type ceramic package for containing a semiconductor chip 52; an insulating layer 51 comprises a metal wire distribution therein and a plurality of metal pins 53 being arranged on the insulating layer 51 to electrically connect the semiconductor chip 52 to outer circuits. In a concave portion of the insulating layer 51 is mounted a semiconductor chip 52.

FIGS. 10 and 11 are cross sectional views depicting other embodiments of a composite type wiring board according to the third invention of the present application. In the embodiment depicted in FIG. 10, the board is constituted of two layers; a first layer comprises insulating layer 31 made of silicon nitride and metal conductors 32 made of tungsten, which are formed in the insulating layer 31; and a second layer comprising a ceramic layer 61 made of cordierite series ceramic and a metal conductor 62 made of copper. It should be noted that the ceramic layer 61 made of cordierite series ceramic can be sintered at a low temperature. A semiconductor chip 37 is arranged in the concave portion of the composite type base plate; and the chip 37 is connected to the metal conductor 62 by means of bonding wire 38. It should be noted that the semiconductor chip 37 is sealed by a cap 63. On the composite type board are provided metal lead wires 64 to electrically connect the semiconductor chip 37 to the outer circuit.

In the embodiment shown in FIG. 11, the board also comprises two layers, which constitutes a composite type wiring board. A first layer comprises insulating layer 31 made of silicon nitride and metal conductors 32, as well as in the embodiment shown in FIG. 10, and a second layer comprises insulator layers 71 made of polyimide series resin and metal conductors 72 made of a thin gold layer.

Actual examples of the process for producing the heat radiation plate of ceramic package for containing a semiconductor chip or the base plate for wiring according to the inventions of the present application will be explained below.

EXAMPLE 1

In Example 1, fifteen kinds of samples were prepared as shown in Table 1 below. Rare earth element oxides shown in Table 1 were added to each of fifteen samples of silicon nitride powder as sintering additives. Water was added to the powder, and the silicon nitride powder and the sintering additives were mixed in a wet manner in a pot made of resin with the aid of silicon nitride media to obtain a slurry. It should be noted that the amounts of $Al_2O_3$ contained in the samples of silicon nitride powder are different, respectively. The thus obtained slurry was dried and granulated by a spray dryer. The granulated powder was formed into a predetermined shape by a dry press with the aid of a mold. The thus shaped bodies were sintered under a nitride atmosphere of 9.5 air pressure at a temperature of $1750° \sim 1950°$ C. for $1 \sim 10$ hours, as shown in Table 1.

The thermal conductivity of the thus obtained sintered body was measured by a laser flash method; and the number of grain boundaries of silicon nitride per 10 $\mu m$ length when measured along a straight line drawn in an arbitrary section of the sintered body was obtained. The number of grain boundaries of silicon nitride was measured in the following manner. First, a photograph of a fine structure of the arbitrary section of the silicon nitride sintered body was taken by a scanning electron microscope with a magnification at which the grain boundaries of $Si_3N_4$ can be identified individually.

Next, a straight line was drawn on the photograph to count the number of grain boundaries which passed across along the straight line. A straight line was drawn over plural photographs continuously until the number of grain boundaries exceeded 1000, and the total distance L ($\mu m$) of the straight line which was required to count 1000 grain boundaries was determined. Then the number of the grain boundaries per 10 $\mu m$ was determined by calculating the formula of $(1000/L) \times 10$. For instance, when a straight line of 500 $\mu m$ is required to count 1000 grain boundaries, the number of the grain boundaries per 10 $\mu m$ is 20.

The amount of $Al_2O_3$ contained in the sintered body was measured by fluoroscopy. The measured amounts are shown in Table 1. The thermal expansion coefficient was about $2 \sim 4$ ppm/°C. concerning all of the samples shown in Table 1.

The thus obtained sintered body was applied to a heat radiating plate of the ceramic package for containing a semiconductor chip shown in FIG. 1. The wiring board made of mullite ceramic in which are formed conductors made of tungsten was used. The heat radiating plate and the base plate were connected by means of an activated metal made of Ag solder into which a little amount of Ti was added. In the thus obtained packages, semiconductor chips were actually mounted, respectively, and the chips were operated, resulting in generation of heat in each chip. The packages were cooled in air at a wind speed of 4 m/s, and then the thermal resistance of each package was measured. The results are shown in Table 1. For a comparison, a heat radiating plate made of alumina was prepared; its thermal resistance was 22° C./W.

From Table 1, it is proved that the heat radiating plate made of silicon nitride has a heat dissipation characteristic which is better than that of alumina; and proved that the heat radiating plate, which is made of silicon nitride characterized in that the number of grain boundaries of silicon nitride per straight line of 10 $\mu m$ is 20 or fewer and the amount of $Al_2O_3$ contained in the plate is 0.3 wt % or less, particularly has a better characteristic as a heat radiating plate. If the number of grain boundaries per straight line of 10 $\mu m$ is more than 20, the thermal dispersion around the grain boundaries becomes large, so the thermal conductivity becomes small. It is considered that if the amount of $Al_2O_3$ is more than 0.3 wt %, the $Al_2O_3$ contained in the sintered body would be melted into the grain boundaries of silicon nitride, resulting in the decrease of thermal conductivity of the grain boundaries of the silicon nitride.

TABLE 1

| No. | Rare earth element oxide (mol %) | Sintering condition temperature, time | Thermal conductivity (W/mk) | Numbers of $Si_3N_4$ grains (per 10 $\mu m$) | $Al_2O_3$ (wt %) | Package thermal resistance (°C./W) |
|---|---|---|---|---|---|---|
| 1 | $Y_2O_3$ (1.5), $Yb_2O_3$ (3.5) | 1900° C. 2h | 75 | 10 | 0.07 | 13 |
| 2 | $Y_2O_3$ (1.5), $Yb_2O_3$ (3.5) | 1900° C. 10h | 96 | 7 | 0.07 | 11 |
| 3 | $Y_2O_3$ (1.5), $Yb_2O_3$ (3.5) | 1800° C. 10h | 70 | 15 | 0.06 | 13 |
| 4 | $Y_2O_3$ (4.8) | 1900° C. 2h | 69 | 12 | 0.15 | 14 |
| 5 | $Y_2O_3$ (4.8) | 1900° C. 2h | 58 | 11 | 0.25 | 15 |
| 6 | $Y_2O_3$ (4.8) | 1900° C. 2h | 39 | 12 | 0.35 | 20 |
| 7 | $Y_2O_3$ (1.5), $Yb_2O_3$ (3.5) | 1750° C. 1h | 25 | 27 | 0.10 | 22 |
| 8 | $Y_2O_3$ (4.8) | 1800° C. 1h | 38 | 23 | 0.15 | 19 |
| 9 | $Y_2O_3$ (1.5), $Yb_2O_3$(3.5) | 1950° C. 1h | 99 | 4 | 0.06 | 10 |
| 10 | $Y_2O_3$ (1.5), $Yb_2O_3$(3.5) | 1800° C. 10h | 60 | 16 | 0.30 | 14 |
| 11 | $Y_2O_3$ (1.5), $Yb_2O_3$(3.5) | 1800° C. 10h | 40 | 16 | 0.45 | 18 |
| 12 | $Y_2O_3$ (1.5), $Yb_2O_3$(3.5) | 1800° C. 5h | 47 | 17 | 0.07 | 18 |
| 13 | $Y_2O_3$ (1.5), $Yb_2O_3$(3.5) | 1800° C. 5h | 40 | 20 | 0.07 | 20 |
| 14 | $Yb_2O_3$ (4.8) | 1900° C. 2h | 56 | 13 | 0.25 | 14 |

TABLE 1-continued

| No. | Rare earth element oxide (mol %) | Sintering condition temperature, time | Thermal conductivity (W/mk) | Numbers of Si$_3$N$_4$ grains (per 10 μm) | Al$_2$O$_3$ (wt %) | Package thermal resistance (°C./W) |
| --- | --- | --- | --- | --- | --- | --- |
| 15 | Y$_2$O$_3$ (2.9), MgO (9.8), ZrO$_2$ (0.4) | 1800° C. 6h | 65 | 13 | 0.15 | 15 |

EXAMPLE 2

A slurry was made in such a manner to form a powder which is capable to be sintered at a low temperature. 90 wt % of glass powder having a cordierite series composition and 10 wt % of alumina powder, acrylic organic binder, plasticizer, toluene and alcoholic solvent were mixed in a pot made of alumina with the aid of balls made of alumina. A green tape having a thickness of 0.3 mm was formed from the sullery by a doctor blade method.

Further, an acrylic organic binder and a telepineol series organic solvent were mixed by using three rollers to obtain a conductive paste for printing conductors on the green tapes. Then, conductive wire distribution patterns of the paste were printed on said green tapes. The green tapes, on which the conductive patterns are printed, were stacked, and the stacked green tapes were put onto a board made of silicon nitride, which was prepared by the same manner of the first example explained in the above. The board and the green tapes were pressed at a temperature of 100° C. under a pressure of 100 Kg/cm$^2$ to be integrated. Each of the conductors formed between the green tapes were connected to each other via through-holes, which were formed through the green tapes by punching. The thus obtained integrated body was sintered in an air at a temperature of 900° C. As a result, the packages as shown in FIG. 2 could be obtained. Each package comprises a wiring board, which was sintered at a low temperature, and a board made of silicon nitride. The metal lead wires are connected to the packages by means of a solder of an Au-Sn alloy.

EXAMPLE 3

The packages as shown in FIG. 3 were obtained in such a manner that on the heat radiating plate made of silicon nitride was arranged on wiring board made of photosensitive polyimide series resin. In the wiring board there is formed a multi-layered wire distribution circuit by using thin layers of Au formed by the sputtering. The conductive patterns formed on and in the board are connected to each other by means of via holes formed by a photolithography.

EXAMPLE 4

Fifteen samples of silicon nitride, which differ in an amount of Al$_2$O$_3$ added thereto were prepared. Rare earth element oxides shown in Table 2 were added to each sample of silicon nitride powder as sintering additives. Water was added thereto, and then the silicon nitride powder and the sintering additives were mixed with each other in a wet manner in a pot made of resin with the aid of media made of silicon nitride; as a result, slurries were obtained. The thus obtained slurries were dried and granulated with the aid of the spray dryer. The granulated powder was formed into a predetermined shape by the dry press with the aid of a mold. The thus shaped bodies were sintered under a nitride atmosphere at an air pressure of 9.5 at a temperature of 1750°~1950° C. for 1~10 hours, as shown in Table 2, to obtain ceramic bases and ceramic caps.

Thermal conductivities of the thus obtained ceramic bases and ceramic caps were measured by the laser flash method, and the number of grain boundaries of silicon nitride per a length of 10 μm of straight line drawn on an arbitrary section of the ceramic bases and ceramic caps was obtained by the same manner as that of Example 1.

The amount of Al$_2$O$_3$ was measured by fluoroscopy. The measured amounts are shown in Table 2. The thermal expansion coefficients were about 2~4 ppm/°C. concerning all of the samples shown in Table 2.

Packages with 160 pins for containing a semiconductor chip as shown in FIG. 4 were prepared by using the obtained ceramic bases and ceramic caps. Semiconductor chips were actually mounted in the packages and operated to be heated. Then, the packages were cooled in air at a wind speed of 4 m/s to measure thermal resistance of the packages. The results are shown in Table 2. For a comparison, a package in which the base and cap made of alumina was prepared; and its thermal resistance was 27° C./W.

TABLE 2

| No. | Rare earth element oxide (mol %) | Sintering condition temperature, time | Thermal conductivity (W/mk) | Numbers of Si$_3$N$_4$ grains (per 10 μm) | Al$_2$O$_3$ (wt %) | Package thermal resistance (°C./W) |
| --- | --- | --- | --- | --- | --- | --- |
| 1 | Y$_2$O$_3$ (1.5), Yb$_2$O$_3$ (3.5) | 1900° C. 2h | 75 | 10 | 0.07 | 18 |
| 2 | Y$_2$O$_3$ (1.5), Yb$_2$O$_3$ (3.5) | 1900° C. 10h | 96 | 7 | 0.07 | 16 |
| 3 | Y$_2$O$_3$ (1.5), Yb$_2$O$_3$ (3.5) | 1800° C. 10h | 70 | 15 | 0.06 | 19 |
| 4 | Y$_2$O$_3$ (4.8) | 1900° C. 2h | 69 | 12 | 0.15 | 19 |
| 5 | Y$_2$O$_3$ (4.8) | 1900° C. 2h | 58 | 11 | 0.25 | 20 |
| 6 | Y$_2$O$_3$ (4.8) | 1900° C. 2h | 39 | 12 | 0.35 | 25 |
| 7 | Y$_2$O$_3$ (1.5), Yb$_2$O$_3$ (3.5) | 1750° C. 1h | 25 | 27 | 0.10 | 26 |
| 8 | Y$_2$O$_3$ (4.8) | 1800° C. 1h | 38 | 23 | 0.15 | 26 |
| 9 | Y$_2$O$_3$ (1.5), Yb$_2$O$_3$(3.5) | 1950° C. 1h | 99 | 4 | 0.06 | 15 |
| 10 | Y$_2$O$_3$ (1.5), Yb$_2$O$_3$(3.5) | 1800° C. 10h | 60 | 16 | 0.30 | 19 |
| 11 | Y$_2$O$_3$ (1.5), Yb$_2$O$_3$(3.5) | 1800° C. 10h | 48 | 16 | 0.45 | 22 |
| 12 | Y$_2$O$_3$ (1.5), Yb$_2$O$_3$(3.5) | 1800° C. 5h | 47 | 17 | 0.07 | 22 |
| 13 | Y$_2$O$_3$ (1.5), Yb$_2$O$_3$(3.5) | 1800° C. 5h | 40 | 20 | 0.07 | 24 |
| 14 | Yb$_2$O$_3$ (4.8) | 1900° C. 2h | 56 | 13 | 0.25 | 18 |
| 15 | Y$_2$O$_3$ (2.9), MgO (9.8), ZrO$_2$ (0.4) | 1800° C. 6h | 65 | 13 | 0.15 | 19 |

EXAMPLE 5

Packages with 120 pins having their structures shown in FIG. 5 were prepared in the same manner of the Example 4. Semiconductor chips were actually mounted in the packages and operated to be heated. Then, the packages were cooled in air at wind speed of 4 m/s to measure the thermal resistances of the packages. The results are shown in Table 3. For comparison, a package, in which the base and cap made of alumina, having its structure as shown in FIG. 5 was prepared; its thermal resistance was 24° C./W.

tion of each conductor formed on the green tapes was realized by forming through-holes by punching.

The thus obtained integrated green tapes were sintered in air under a nitride atmosphere of 9.5 pressure at a temperature of 1850° C. for four hours. Then, metal pins were arranged on the sintered body by means of solder after nickel plating was executed on the surface of the body. Gold plating is then executed on the conductors formed on the surface of the body and on the surfaces of the metal pins. As a result, the package as shown in FIG. 6 could be obtained.

TABLE 3

| No. | Rare earth element oxide (mol %) | Sintering condition temperature, time | Thermal conductivity (W/mk) | Numbers of $Si_3N_4$ grains (per 10 μm) | $Al_2O_3$ (wt %) | Package thermal resistance (°C./W) |
|---|---|---|---|---|---|---|
| 1 | $Y_2O_3$ (1.5), $Yb_2O_3$ (3.5) | 1900° C. 2h | 75 | 10 | 0.07 | 14 |
| 2 | $Y_2O_3$ (1.5), $Yb_2O_3$ (3.5) | 1900° C. 10h | 96 | 7 | 0.07 | 12 |
| 3 | $Y_2O_3$ (1.5), $Yb_2O_3$ (3.5) | 1800° C. 10h | 70 | 15 | 0.06 | 15 |
| 4 | $Y_2O_3$ (4.8) | 1900° C. 2h | 69 | 12 | 0.15 | 15 |
| 5 | $Y_2O_3$ (4.8) | 1900° C. 2h | 58 | 11 | 0.25 | 16 |
| 6 | $Y_2O_3$ (4.8) | 1900° C. 2h | 39 | 12 | 0.35 | 22 |
| 7 | $Y_2O_3$ (1.5), $Yb_2O_3$ (3.5) | 1750° C. 1h | 25 | 27 | 0.10 | 23 |
| 8 | $Y_2O_3$ (4.8) | 1800° C. 1h | 38 | 23 | 0.15 | 20 |
| 9 | $Y_2O_3$ (1.5), $Yb_2O_3$(3.5) | 1950° C. 1h | 99 | 4 | 0.06 | 11 |
| 10 | $Y_2O_3$ (1.5), $Yb_2O_3$(3.5) | 1800° C. 10h | 60 | 16 | 0.30 | 16 |
| 11 | $Y_2O_3$ (1.5), $Yb_2O_3$(3.5) | 1800° C. 10h | 48 | 16 | 0.45 | 19 |
| 12 | $Y_2O_3$ (1.5), $Yb_2O_3$(3.5) | 1800° C. 5h | 47 | 17 | 0.07 | 19 |
| 13 | $Y_2O_3$ (1.5), $Yb_2O_3$(3.5) | 1800° C. 3h | 40 | 20 | 0.07 | 21 |
| 14 | $Yb_2O_3$ (4.8) | 1900° C. 2h | 56 | 13 | 0.25 | 14 |
| 15 | $Y_2O_3$ (2.9), MgO (9.8), $ZrO_2$ (0.4) | 1800° C. 6h | 65 | 13 | 0.15 | 15 |

From Tables 2 and 3, it is proved that the heat radiating plate made of silicon nitride has an excellent heat dissipation characteristic in comparison to the heat radiating plate made of alumina; and proved that the heat radiating plate, made of silicon nitride sintered body characterized in that the number of grain boundaries of silicon nitride per straight line of 10 μm is 20 or less and the amount of $Al_2O_3$ contained in the plate is 0.3 wt % or less, particularly has an even better characteristic as a heat radiating plate. If the number of grain boundaries per straight line of 10 μm is more than 20, the thermal dispersion around the grain boundaries becomes large, so the thermal conductivity becomes small. It is considered that if the amount of $Al_2O_3$ contained in the sintered body is more than 0.3 wt %, the $Al_2O_3$ is melted into the grain boundaries of silicon nitride, resulting in the decrease of thermal conductivity of the grain boundaries of the silicon nitride.

EXAMPLE 6

A slurry was prepared in such a manner that a mixture powder of a predetermined amount of silicon nitride powder, a predetermined amount of yttrium oxide powder and 0.2 wt % of alumina, acrylic organic binder, plasticizer, toluene and alcoholic solvent are mixed with each other in a pot made of resin with the aid of balls made of silicon nitride. Further, green tapes having their thickness of 0.1 mm~0.3 mm were prepared from the slurry by a doctor blade method.

Further, an acrylic organic binder and a telepineolic organic solvent were mixed with each other by three rollers to obtain a conductive paste for use in printed conductors. Conductive wire distribution patterns and earth layers were printed on the green tapes with the aid of the thus obtained paste. The green tapes on which the patterns were printed were stacked, and the stacked green tapes were pressed at a pressure of 100 Kg/cm² and at a temperature 100° C. to be integrated. Connec-

EXAMPLE 7

A board was sintered in the same way as explained in Example 6, but there was no conductor pattern on one of the surfaces of the sintered base plate excepting connecting portions for connecting the conductor patterns formed in the board and metal terminals of the outer circuits. On the conductors formed on the other surface of the board was executed a nickel plating, an on the nickel plating were arranged metal pins with the aid of Ag solder. Both surfaces of the base plate were then processed by buffing. Further, thin films of Cr/Cu were formed on the processed surfaces by sputtering, and the conductor patterns were formed by the photo lithography. Furthermore, on the surfaces of the metal pins and the thin film patterns, executed nickel plating and gold plating. As a result, the wiring board shown in FIG. 7 could be obtained.

EXAMPLE 8

The green tapes were prepared in the same way as explained in Example 6, the green tapes were stacked to a predetermined thickness. The thus obtained stacked green tapes were sintered to obtain a ceramic wiring board. After buffing both surfaces of the ceramic board, thick film conductor patterns were printed on the surfaces with the aid of conductive paste of Ag series, Au type and Cu series by a general screen printing method. Then the board was sintered again at a predetermined sintering atmosphere and at a predetermined sintering temperature. As a result, the base plate shown in FIG. 8 was obtained.

EXAMPLE 9

Pin grid array type packages having 120 pins illustrated in FIG. 9 were prepared as well as Example 6. The sintering additives used and the sintering conditions are shown in Table 4. The ceramic bodies were sintered under a nitrogen atmosphere of 9.5 atmospheres air pressure. The numbers of grain boundaries of silicon nitride contained in the packages were calculated by counting the number of grain boundaries of silicon nitride per length of 10 μm measured along a straight line drawn in an arbitrary section of each package. The number of grain boundaries of silicon nitride per a length of 10 μm in each package was measured in the following manner. First, a photograph of a fine structure of the arbitrary section of the silicon nitride package was picked by a scanning electron microscope with a magnification at which the grain boundaries of $Si_3N_4$ can be identified individually. Next, a straight line was drawn on the photograph to count the number of the grain boundaries which are passed across along the straight line. The straight line was drawn over plural photographs continuously until the number of the grain boundaries exceeded 1000, and the total distance L (μm) of the straight line which was required to count 1000 grain boundaries was determined. Then the number of the grain boundaries per 10 μm was determined by calculating the formula of $(1000/L) \times 10$. For instance, when a straight line having a length of 500 μm is required to count 1000 grain boundaries, the number of the grain boundaries per 10 μm is 20. Only a β type silicon nitride was detected from all samples except sample No. 6. From the sample No. 6, a little amount of an α type silicon nitride was detected. The amount of $Al_2O_3$ was measured by a fluoroscopy. The measured amounts of $Al_2O_3$ contained in the samples are shown in Table 4. The thermal conductivities shown in Table 4 were measured by the laser flash method. The thermal expansion coefficients were about 2~4 ppm/°C. for concerning all of the samples shown in Table 4.

In the thus obtained package, semiconductor chips were actually mounted and the chips were operated to generate heat. The packages were then cooled in air at a wind speed of 4 m/s, and thermal resistances of the packages were measured. The results are shown in Table 4. For a comparison, a heat radiating plate made of alumina was prepared; its thermal resistance was 22° C./W.

From Table 4, it is proved that the heat radiating plate made of silicon nitride has an excellent heat dissipation in comparison with the heat radiating plate made of alumina; and proved that the heat radiating plate, made of silicon nitride characterized in that the number of grain boundaries of silicon nitride, per straight line of 10 μm is 20 or fewer and the amount of $Al_2O_3$ contained in the plate is 0.3 wt % or less, and particularly has a better characteristic as a heat radiating plate. If the number of grain boundaries per straight line of 10 μm is more than 20, the thermal dispersion around the grain boundaries becomes large, so the thermal conductivity of the plate becomes small. It is considered that if the amount of $Al_2O_3$ is more than 0.3 wt %, the $Al_2O_3$ contained in the sintered body would be melted into the grain boundaries of silicon nitride, resulting in the decrease of thermal conductivity of the grain boundaries of the silicon nitride.

EXAMPLE 10

A slurry was made in such a manner that a powder is formed which is capable to be sintered at a low temperature. 90 wt % of glass powder having a cordierite series composition and 10 wt % of alumina powder, acrylic organic binder, plasticizer, toluene and alcoholic solvent were mixed in a pot made of alumina with the aid of balls made of alumina. A green tape having its thickness of 0.3 mm was formed from the slurry by a doctor blade method.

Further, an acrylic organic binder and a telepineol series organic solvent were mixed by using three rollers to obtain a conductive paste for printing conductors on the green tapes. Then, conductive wire distribution patterns of the paste were printed on the green tapes. The green tapes, on which the conductive patterns were printed, were stacked, and the stacked green tapes were put onto a base plate made of silicon nitride, which was prepared in the same manner as the sixth example explained above. The base plate and the green tapes were pressed at a temperature of 100° C. under a pressure of 100 Kg/cm² to be integrated. Each of the conductors formed between the green tapes were connected to each other via through-holes, which were formed through the green tapes by punching. The thus obtained integrated body was sintered in air at a temperature of 900° C. As a result, the packages as shown in FIG. 10 could be obtained. Each package comprises a wiring board which was sintered at a low temperature, and a board made of silicon nitride. The metal lead wires are connected to the package by means of a solder of an Au-Sn alloy.

EXAMPLE 11

The package having a composite structure as shown in FIG. 11 was obtained in such a manner that on a first wiring board made of silicon nitride, which was produced by the same method explained in Example 7, was

TABLE 4

| No. | Rare earth element oxide (mol %) | Sintering condition temperature, time | Thermal conductivity (W/mk) | Numbers of $Si_3N_4$ grains (per 10 μm) | $Al_2O_3$ (wt %) | Package thermal resistance (°C./W) |
| --- | --- | --- | --- | --- | --- | --- |
| 1 | $Y_2O_3$ (1.5), $Yb_2O_3$ (3.5) | 1900° C. 2h | 75 | 10 | 0.07 | 12 |
| 2 | $Y_2O_3$ (1.5), $Yb_2O_3$ (3.5) | 1900° C. 10h | 96 | 7 | 0.07 | 11 |
| 3 | $Y_2O_3$ (1.5), $Yb_2O_3$ (3.5) | 1800° C. 10h | 70 | 15 | 0.06 | 14 |
| 4 | $Y_2O_3$ (4.8) | 1900° C. 2h | 69 | 12 | 0.15 | 13 |
| 5 | $Y_2O_3$ (4.8) | 1900° C. 2h | 58 | 11 | 0.25 | 14 |
| 6* | $Y_2O_3$ (1.5), $Yb_2O_3$ (3.5) | 1750° C. 1h | 25 | 27 | 0.10 | 22 |
| 7* | $Y_2O_3$ (4.8) | 1800° C. 1h | 38 | 23 | 0.15 | 19 |
| 8 | $Y_2O_3$ (1.5), $Yb_2O_3$(3.5) | 1950° C. 1h | 99 | 4 | 0.06 | 11 |
| 9 | $Y_2O_3$ (1.5), $Yb_2O_3$(3.5) | 1800° C. 10h | 60 | 16 | 0.30 | 14 |
| 10 | $Y_2O_3$ (1.5), $Yb_2O_3$(3.5) | 1800° C. 10h | 48 | 16 | 0.45 | 17 |
| 11 | $Y_2O_3$ (1.5), $Yb_2O_3$(3.5) | 1800° C. 5h | 47 | 17 | 0.07 | 17 |
| 12 | $Y_2O_3$ (1.5), $Yb_2O_3$(3.5) | 1800° C. 3h | 40 | 20 | 0.07 | 18 |
| 13 | $Yb_2O_3$ (4.8) | 1900° C. 2h | 56 | 13 | 0.25 | 14 |
| 14 | $Y_2O_3$ (2.9), MgO (9.8), $ZrO_2$ (0.4) | 1800° C. 6h | 65 | 13 | 0.15 | 14 | arranged a second wiring board made of photosensitive polyimide resin. In the second board, there is formed a multi-layered wire distribution circuit by using thin layers of Au formed with the aid of sputtering. The conductive patterns comprised of the multi-layered wire distribution circuit are electrically connected to each other by means of holes formed by photolithography.

As explained above in detail, according to the first and second inventions of the present application, since the heat radiating plate or the wiring board is made of silicon nitride, preferably made of silicon nitride characterized in that the silicon nitride contains aluminum of 0.3 wt % or less when calculated as alumina and contains 20 or less of grain boundaries per 10 μm of straight line, the heat dissipation of the board or the heat radiating plate can be improved. Thus, by arranging such base plate or such heat radiating plate in the ceramic packages, the packages having an improved heat dissipation can be obtained.

Further, according to the third invention, since the wiring board is made of polycrystal body of silicon nitride characterized in that the number of grain boundaries per 10 μm of straight line is 20 or fewer, and that the amount of aluminum contained in the silicon nitride is 0.3 wt % or less when calculated as alumina, the ceramic wiring board having a high reliability, an excellent strength and a high toughness can be obtained.

The characteristic of the ceramic package and the board according to the present invention will be explained in more detail below.

High Heat Dissipation

In the ceramic of silicon nitride used as the material of the package or the board, the number of grain boundaries of polycrystal silicon nitride per 10 μm of the straight line is 20 or fewer, and preferably, the amount of aluminum contained therein is 0.3 wt % or less when calculated in alumina. Further, when the polycrystal silicon nitride is sintered, the sintering additive is generally added to form a liquid phase in the polycrystal silicon nitride when the body is sintered. Typically, rare earth element series oxides, alkali earth series metal oxides or other metal oxides are added as the sintering additives. Further, metal molybdenum, tungsten, their oxide or metal molybdenum compound or tungsten compound is sometimes added as a peculiar additive for coloring the package for containing a semiconductor chip.

Silicon nitride sintering body having any composition can be applied to the present invention provided that the number of polycrystal of silicon nitride and the amount of aluminum contained in the body is less than the above mentioned limitations since the thermal conductivity of the sintered body is determined by the amount of aluminum contained in the body. When the silicon nitride is characterized in that the number of grain boundaries are fewer than the above limitation and the amount of aluminum is also less than the above limitation is sintered at a predetermined sintering condition, the polycrystal silicon nitride sintering body having its thermal conductivity of more than 40 W/mk can be obtained. The package and board made of the thus obtained sintering body would have an excellent heat dissipation in comparison with the package and board made of alumina. When using silicon nitride in which 20 or more grain boundaries of silicon nitride per 10 μm of straight line exist, the thermal conductivity of the ceramic made of such silicon nitride would deteriorate, so that the dissipation of the package and base plate made of such ceramic would also deteriorate.

High Strength

It is an important feature of the present invention that the package and the board made of polycrystal body of silicon nitride present inventions are very strong. The conventional package and base plate made of alumina have about 30 kg/mm$^2$ of transverse strength, but the practical strength is worse than the package and base plate made of resin, due to brittleness of ceramic. However, the package and board made of silicon nitride according to the present invention have a transverse strength of more than 30 kg/mm$^2$ and a breakdown toughness of 5 MPam$^{\frac{1}{2}}$. That is to say, the package and board according to the invention have a greatly improved brittleness in comparison to the conventional alumina package and alumina board.

Further, in the conventional package and board made of aluminum nitride, there is a problem that the mounting portions of the body for mounting metal pins or metal lead wires are apt to be broken due to stress caused by a difference in thermal expansion coefficients of aluminum nitride and metal. However, there is no such problem in the package and base plate according to the present invention because the silicon nitride ceramic has a good breakdown and toughness resistance.

High Reliability

It is further an important feature that the package and base plate according to the present invention prevent damage from the environment. The package and ceramic board made of ceramics have a characteristic that they prevent damage from the environment, such as water, in comparison to the package and base plate made of resin. Thus, the alumina package and alumina base plate, for example, are high reliables. However, the package and board made of aluminum nitride, which has a high heat dissipation, do not prevent damage from water and alkali, and thus the reliability of the package and board is not so high. Contrary to this, the material of the package and base plate according to the invention, i.e. silicon nitride prevents damage from the environment, such as water and alkali.

Electric Characteristic

Silicon nitride characterized in the above mentioned conditions has an excellent electric insulating characteristic. Therefore, there is no problem that the proof voltage is low as in the conventional package and base plate made of silicon carbide. The dielectric coefficient of the silicon nitride material used in the present invention is about 6~8, which is smaller than that of alumina, i.e. (9~10) that of aluminum nitride, (8~9) and that of the silicon carbide (40). Therefore, the package and board of the present invention can be applied as an electric element for transferring signals at high speed and in a high frequency band, because the signal transferring time delay period becomes small in the package and board according to the present invention.

What is claimed is:
1. A ceramic package for containing a semiconductor chip, comprising:
   a wiring board comprising a first wire distribution for transferring electrical signals and a second wire distribution for power supply; and a heat radiating plate for mounting a semiconductor chip thereon, said heat radiating plate being coupled to said wiring board and comprising silicon nitride, wherein said heat radiating plate has not more than 20 grain boundaries per a 10 $\mu$m straight line extending along an arbitrary section of said heat radiating plate.

2. The ceramic package of claim 1, wherein said heat radiating plate contains not more than 0.3 wt % of aluminum when calculated as alumina.

3. The ceramic package of claim 1, wherein said wiring board contains mullite.

4. The ceramic package of claim 1, wherein said wiring board contains a ceramic having a sintering temperature not greater than 1100° C., and wherein wire distribution conductors are formed in the heat radiating plate, said wire distribution conductors comprising an Ag series metal, a Cu series metal, or an Au series metal.

5. The ceramic package of claim 1, wherein said wiring board contains a polyimide series resin.

6. A ceramic package for containing a semiconductor chip, comprising:

a ceramic base for mounting a semiconductor chip thereon, said ceramic base being a silicon nitride sintered body, wherein said ceramic base has not more than 20 grain boundaries per a 10 $\mu$m straight line extending along an arbitrary section of said ceramic base;

a ceramic cap covering said ceramic base and being connected to said ceramic base by a glass or resin agent to seal the semiconductor chip in the ceramic package; and a metal lead frame arranged between the ceramic base and said ceramic cap.

7. A ceramic package containing a semiconductor chip, comprising:

a ceramic base for mounting a semiconductor chip thereon, said ceramic base being a silicon nitride sintered body, said ceramic base comprising not more than 0.3 wt % of aluminum when calculated as alumina;

a ceramic cap covering said ceramic base and being connected to said ceramic base by a glass or resin agent to seal the semiconductor chip in the ceramic package; and a metal lead frame arranged between said ceramic base and said ceramic cap.

* * * * *